(12) United States Patent
Mills et al.

(10) Patent No.: US 6,704,376 B2
(45) Date of Patent: Mar. 9, 2004

(54) POWER AND CONFIDENCE ORDERED LOW COMPLEXITY SOFT TURBOMUD WITH VOTING SYSTEM

(75) Inventors: Diane G. Mills, Wilmington, MA (US); Rachel E. Learned, Waltham, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 10/208,409

(22) Filed: Jul. 29, 2002

(65) Prior Publication Data

US 2003/0138065 A1 Jul. 24, 2003

Related U.S. Application Data

(63) Continuation-in-part of application No. 10/055,155, filed on Jan. 23, 2002, which is a continuation-in-part of application No. 10/120,955, filed on Apr. 11, 2002.

(51) Int. Cl.[7] .................................................. H03D 1/00

(52) U.S. Cl. ...................................................... 375/341

(58) Field of Search ................................ 375/262, 265, 375/341, 346; 714/759, 791, 793, 794, 795, 797

(56) References Cited

U.S. PATENT DOCUMENTS

| | | | |
|---|---|---|---|
| 5,506,861 A | | 4/1996 | Bottomley |
| 5,563,897 A | | 10/1996 | Pyndiah et al. |
| 6,023,783 A | * | 2/2000 | Divsalar et al. ............ 714/792 |
| 6,122,269 A | | 9/2000 | Wales |
| 6,151,370 A | | 11/2000 | Wei |
| 6,167,022 A | | 12/2000 | Ishida et al. |
| 6,182,261 B1 | | 1/2001 | Haller et al. |
| 6,298,461 B1 | * | 10/2001 | Tong et al. .................. 714/755 |
| 6,397,367 B1 | * | 5/2002 | Park et al. ................... 714/786 |
| 6,453,442 B1 | * | 9/2002 | Sadjadpour et al. ........ 714/787 |
| 6,473,417 B1 | * | 10/2002 | Herzog ........................ 370/342 |
| 6,510,536 B1 | * | 1/2003 | Crozier et al. .............. 714/755 |
| 6,570,919 B1 | * | 5/2003 | Lee ............................. 375/233 |

OTHER PUBLICATIONS

Pottie, Gregory J. et al., A Comparison of Reduced Complexity Decoding Algorithms for Trellis Codes, IEEE Journal, Dec. 1989, vol. 7., No. 9.

Berrou, Claude et al., Near Optimum Error Correcting Coding and Decoding: Turbo–Codes, IEEE Transaction on Communications, Oct. 1996, vol. 44, No. 10.

Berrou, Claude et al., Near Shannon Limit Error—Correcting Coding and Decoding: Turbo Codes(1), IEEE, 1993, pp. 1064–1070.

(List continued on next page.)

*Primary Examiner*—Emmanuel P Bayard
(74) *Attorney, Agent, or Firm*—Maine & Asmus

(57) ABSTRACT

A real-time multi-user detection (MUD) receiver processing simultaneous digitally modulated interferers and transmissions in the same frequency optimizing performance for heavily loaded and overloaded multiple access systems by implementing an iterative TurboMUD receiver using tree-pruning, including confidence ordering, power-ordering, and a voting procedure. On the first iteration, user indices are ordered according to received powers. On subsequent iterations, the voting system provides soft decisions or confidence values utilized as soft inputs to single-user decoders. Voting is computationally attractive and allows the bank of decoders to operate on soft values, improving performance and reducing the number of turboMUD iterations. The bank of soft output error correction decoders produces an improved set of soft decisions or confidence values corresponding to the channel bits transmitted by each interfering user. Confidence values from the bank of decoders are used to order user indices, allowing the tree pruned MUD detector to operate on the most reliable symbols first, improving the likelihood that pruning is correct. Subsequent confidence ordering and estimate refinement occurs until conditions are satisfied and iterative processing completed.

23 Claims, 5 Drawing Sheets

OTHER PUBLICATIONS

Duanyi, Wang et al, Low–Complexity MAP Decoding for Turbo Codes: Vehicular Technology Conference, 2000, pp. 1035–1039, Princeton University, Princeton NJ.

Herzog, Rupert et al, Iterative Decoding and Despreading improves CDMA–Systems using M–ary Orthogonal Modulation and FEC, IEEE, 1997, pp. 909–913.

Das, Suman et al., Computationally Efficient Iterative Multiuser Detection and Decoding, Asilormar 1998, Department of Electrical and Computer Engineering, Rice University, Houston, Texas.

Wang, Xiaodong et al, Iterative (Turbo) Soft Interference Cancellation and Decoding for Coded CDMA, IEEE, Jul. 1999, vol. 47, No. 7.

Poor, Vincent, Turbo Multiuser Detection: An Overview, Department of Electrical Engineering, IEEE $6^{th}$ International Symposium on Spread–Spectrum Tech. & Appliances, Sep. 2000, Princeton University, Princeton NJ.

Alexander, Paul et al., Iterative Multiuser Interference Reduction: Turbo CDMA, IEEE Transactions on Communications, Jul. 1999, vol. 47, No. 7.

Hagenauer, Joachim et al, A Viterbi Algorithm with Soft–Decision Outputs and its Applications, IEEE, 1989.

Robertson, Patrick, A Comparison of Optimal and Sub–Optimal MAP Decoding Algorithms Operating in the Log Domain, IEEE, 1995.

Verdu, S. Minimum Probability of Error For Asynchronous Gaussian Multiple–Access Channels, IEEE Transactions on Information Theory, vol. IT–32, No. 1, Jan. 1986, p. 85–96.

Lupas, Ruxandra et al, Linear Multiuser Detectors for Synchronous Code–Division Multiple–Access Channels, IEEE Transactions on Information Theory, vol. 35, No. 1, Jan. 1989, p. 123–136.

Lupas, Ruxandra et al, Near–Far Resistance of Multiuser Detectors for Asynchronous Channels, IEEE Transactions on Information Theory, vol. 38, No. 4, Apr. 1990, p. 496–508.

* cited by examiner ed States Patent

POWER AND CONFIDENCE ORDERED LOW COMPLEXITY SOFT TURBOMUD WITH VOTING SYSTEM

CROSS REFERENCE TO RELATED APPLICATIONS

This application claims priority to co-pending U.S. Utility patent application Ser. No. 10/055,155 filed Jan. 23, 2002; and to co-pending U.S. Utility application Ser. No. 10/120, 955 filed Apr. 11, 2002. A related application Ser. No. 10/207,490 entitled METHOD AND APPARATUS FOR OPTIMIZING TREE PRUNING IN A MULTI USER DETECTOR, U.S. Utility Patent Application Ser. No. 10/207,490, filed Jul. 29, 2002 (D4612) is incorporated herein by reference for all purposes.

STATEMENT OF GOVERNMENT INTEREST

Not Applicable.

BACKGROUND OF THE INVENTION

1. Technical Field of the Invention

This present invention relates to telecommunications processing and more particularly to advanced receiver techniques in a multi-user environment.

2. Background Art

The telecommunications industry has been expanding at an unprecedented growth rate. In particular, the wireless sector, including 3G, wireless local area networks and Bluetooth devices, has grown far beyond expectations and at a much higher rate than the fixed telecommunications counterpart. The ability to access data and communicate anywhere at anytime has enormous potential and commercial value.

The content of the wireless sector is also changing, with more and more data being transmitted, including Internet connectivity and live feeds. The usage involving personal digital assistants (PDA's) and even smart appliances have created new markets utilizing wireless data communications. And, this wireless phenomenon is not limited to any geographical boundaries, as the growth is occurring around the globe.

Although Code Division Multiple Access (CDMA) or spread spectrum communications has been around for many years, there is an increasing interest in using spread spectrum systems in commercial applications to allow superior quality performance and a greater number of users within a given bandwidth. The digital format of CDMA architecture allows complex processing and high-level algorithms for transmission and reception.

Despite the advancements in wireless transmission and reception, there are still problems related to seamless connectivity, multimedia traffic, battery life, security, and mobility to name a few. In general, wireless channels are subject to well-known problems and there are continuous efforts to improve capacity and quality. One of the growing problems is being able to process multiple users in a given bandwidth.

For example, a base station that processes a number of cellular devices has to receive and transmit data within a certain frequency range. The ability to extract the correct data from a given user is a difficult task, especially when the effects of interference and multipaths are considered. The problem is further complicated when the number of users exceeds the number of dimensions, resulting in an overloaded condition.

In the past, prior art communication systems generally utilized Frequency Division Multiple Access (FDMA) and Time Division Multiple Access (TDMA) methods to achieve channel access. FDMA refers to a communication channel wherein a signal's transmission power is concentrated into a single radio frequency band. Interference from adjacent channels is limited by the use of band pass filters however for each channel being assigned a different frequency, system capacity is limited by the available frequencies and by limitations imposed by channel reuse.

In TDMA systems, a channel consists of a time slot or frame in a periodic train of time intervals over the same frequency, with a given signal's energy confined to one of these time slots. Adjacent channel interference is limited by the use of a time gate or other synchronization element that only passes signal energy received at the proper time. The system capacity is limited by the available time slots as well as by limitations imposed by channel reuse, as each channel is assigned a different time slot.

One of the goals of FDMA and TDMA systems is to try and prevent two potentially interfering signals from occupying the same frequency at the same time. In contrast, Code Division Multiple Access (CDMA) techniques allow signals to overlap in both time and frequency. CDMA signals share the same frequency spectrum and in the frequency or time domain, the CDMA signals appear to overlap one another. The scrambled signal format of CDMA eliminates cross talk between interfering transmission and makes it more difficult to eavesdrop or monitor calls therefore providing greater security.

In a CDMA system, each signal is transmitted using spread spectrum techniques. The transmitted informational data stream is impressed upon a much higher rate data stream termed a signature sequence. The bit stream of the signature sequence data is typically binary, and can be generated using a pseudo-noise (PN) process that appears random, but can be replicated by an authorized receiver. The informational data stream and the high bit rate signature sequence stream are combined by multiplying the two bit streams together, assuming the binary values of the two bit streams are represented by +1 or −1. This combination of the higher bit rate signal with the lower bit rate data stream is called spreading the informational data stream signal. Each informational data stream or channel is allocated a unique signature sequence.

In operation, a plurality of spread information signals, such as binary phase shift keying (BPSK) or quadrature phase shift keying (QPSK) modulation, modulate a radio frequency (RF) carrier and are jointly received as a composite signal at the receiver. Each of the spread signals overlaps all of the other spread signals, as well as noise-related signals, in both frequency and time. The receiver correlates the composite signal with one of the unique signature sequences, and the corresponding information signal is isolated and despread.

A signature sequence is normally used to represent one bit of information. Receiving the transmitted sequence or its complement indicates whether the information bit is a +1 or −1, sometimes denoted "0" or "1". The signature sequence usually comprises N pulses, and each pulse is called a "chip". The entire N-chip sequence, or its complement, depending on the information bit to be conveyed, is referred to as a transmitted symbol.

The receiver correlates the received signal with the complex conjugate of the known signature sequence to produce a correlation value. When a 'large' positive correlation results, a "0" is detected, and when a 'large' negative correlation results, a "1" is detected.

It should be understood that the information bits could also be coded bits, where the code is a block or convolutional code. Also, the signature sequence can be much longer than a single transmitted symbol, in which case a subsequence of the signature sequence is used to spread the information bit.

Further descriptions of CDMA communications techniques are described in U.S. Pat. No. 5,506,861. This patent describes radiotelephone communication systems, and in particular, receivers for jointly demodulating a plurality of CDMA signals with multipath time dispersion.

The prior art systems do not properly account for the real world mobile communication signals that suffer from signal degradation such as interference and multipath problems. The systems of the prior art generally tended to make assumptions that all other interferers and multipaths were additive white Gaussian noise. However, this assumption is not accurate for co-channel interference and multipaths.

Multipath dispersion occurs when a signal proceeds to the receiver along not one but many paths so that the receiver encounters echoes having different and randomly varying delays and amplitudes. Co-channel interference refers to signals received from other users either directly or reflected. The receiver receives a composite signal of multiple versions of the transmitted symbol that have propagated along different paths, called rays, having different relative time. Each distinguishable ray has a certain relative time of arrival at a certain amplitude and phase, and as a result, the correlator outputs several smaller spikes. RAKE receivers are well known in the art and attempt to 'rake' together all the contributions to detect the transmitted symbol and recover the information bit.

Conventional RAKE receivers provide satisfactory performance under ideal conditions, however, the signature sequence must be uncorrelated with time shifted versions of itself as well as various shifted versions of the signature sequences of the other CDMA signals. If one received signal corresponding to the signature sequence of interest has a non-negligible cross correlation with the received signal originating from another transmitter, then the value measured at the receiver, e.g. the correlation value for the signal of interest, is corrupted. In other words, the correlation computed at the receiver that would be used to decode a particular signal of interest is overwhelmed by an interfering signal, this is referred to as the near-far problem. The interference caused by an echo of one transmitted symbol overlapping with the next transmitted symbol must also be negligible.

If this is not true, the transmitted symbols interfere with past and future transmitted symbols, which is commonly referred to as intersymbol interference (ISI). In actuality, performance is degraded by other signal interference and ISI. There has been much research to address signal interference with known multipath time dispersion. This is termed joint demodulation with no multipath and is further described in S. Verdu, "Minimum Probability of Error For Asynchronous Gaussian Multiple-Access Channels," IEEE Trans. Info. Theory, Vol. IT-32, pp. 85–96, R. Lupas and S. Verdu, "Linear multiuser detectors for synchronous code-division multiple-access channels," IEEE Trans. Inform. Theory, Vol. 35, pp. 123–136, January 1989; and R. Lupas and S. Verdu, "Near-far resistance of multiuser detectors in asynchronous channels," IEEE Trans. Commun., Vol. 38, pp. 496–508, April 1990.

There are a host of approaches for jointly demodulating any set of interfering digitally modulated signals, including multiple digitally modulated signals. Maximum Likelihood Sequence Estimation determines the most likely set of transmitted information bits for a plurality of digital signals without multipath time dispersion. The maximum likelihood joint demodulator is capable, in theory, of accommodating the largest number of interfering signals, but has a prohibitive computational complexity that makes it unrealizable in practice. The decorrelation receiver is another, less computationally complex receiver processing approach that zeroes out or decorrelates the different signals so that they no longer interfere with one another. The decorrelator, as well as virtually every other lower complexity joint demodulator, is not capable of operation when the number of signals is over a set threshold which falls significantly short of the theoretical maximum.

In a real world multi-user system, there are a number of independent users simultaneously transmitting signals. These transmissions have the real-time problems of multipath and co-channel interference, fading, and dispersion that affect the received signals. As described in the prior art, multiple user systems communicate on the same frequency and at the same time by utilizing parameter and channel estimates that are processed by a multi-user detector. The output of the multi-user detector is an accurate estimation as to the individual bits for an individual user.

Moreover, in an article by Paul D. Alexander, Mark C. Reed, John A. Asenstorfer and Christian B. Schlagel in IEEE Transactions on Communications, vol. 47, number 7, July 1999, entitled "Iterative Multi-User Interference Reduction: Turbo CDMA," a system is described in which multiple users can transmit coded information on the same frequency at the same time, with the multi-user detection system separating the scrambled result into interference-free voice or data streams.

Emerging receiver processing procedures allow for huge increases in the utilization of multiple access communications, such as wireless cellular phones. The common problem is that the processing procedures in the receivers are difficult to run in real time. Advanced receiver techniques cover several areas, namely interference suppression (also called multi-user detection), multipath combining and space-time processing, equalization, and channel estimation. These various techniques can be mixed and matched depending upon the circumstances. Proper signal processing of transmitter and receiver yield a far greater potential than current systems.

Multi-user detection (MUD) refers to the detection of data in non-orthogonal multiplexes. MUD processing increases the number of bits available per chip or signaling dimension for systems having interference limited systems. A MUD receiver jointly demodulates co-channel interfering digital signals.

Optimal MUD based on the maximum likelihood sequence estimator operates by comparing the received signal with the entire number of possibilities that could have resulted, one for each bit or symbol epoch. Unfortunately, this processing is a computationally complex operation and it is not possible to accomplish in a real-time environment. Thus for those multi-user detectors that examine the entire space, real-time operation is often elusive.

In general, optimal MUD units function by examining a number of possibilities for each bit. However, for multi-user detectors that examine a larger capacity of signal, the computations are complex and time-consuming, thus making real-time operation impossible. Numerous attempts at reliable pruning of the optimal MUD decision process or the use of linear approximation to the replace the optimal MUD have still not produced a workable solution for the real world environment.

There are various multiuser detectors in the prior art, including optimal or maximum likelihood MUD, maximum likelihood sequence estimator for multiple interfering users, successive interference cancellation, TurboMUD or iterative MUD, and various linear algebra based multi-user detectors such as all of those detailed in the well-known text "Multiuser Detection" by Sergio Verdu. In basic terms, turbodecoding refers to breaking a large processing process into smaller pieces and performing iterative processing on the smaller pieces until the larger processing is completed. This basic principle was applied to the MUD.

There are known problems in these prior art concepts. Linear Algebra based MUD (non-iterative) and successive interference cancellation fails for cases of overloaded multiple access systems. One example of overloading is where the number of simultaneous users is doubled relative to existing state of the art. Even for underloaded multiple access systems, the performance of non-iterative MUD and successive interference cancellation degrades significantly as the number of users increases, while the computation complexity of the optimal MUD increases significantly as the number of users increases. The computing problems are so extreme that it requires extensive and expensive hardware as well as complex processing. Moreover, an unreasonable delay would be required to decode each bit or symbol rendering such a system useless in practice.

Reduced complexity approaches based on tree-pruning help to some extent to eliminate the proper bit combination from consideration (i.e. prune the proper path in the decision tree) based on information from an unreliable bit estimate.

The M-algorithm is a pruning process that limits the number of hypotheses extended to each stage to a fixed tree width and prunes based on ranking metrics for all hypotheses and retaining only the M most likely hypotheses. The T-algorithm prunes hypotheses by comparing the metrics representing all active hypotheses to a threshold based on the metric corresponding to the most-likely candidate. Performance of M-algorithm based MUD degrades as the parameter M is decreased, but M governs the number of computations required. Similar effects are seen for other tree-pruning based MUD (T-algorithm, etc). To combat improper pruning, basic tree-pruning must ensure that M is "large enough", and therefore still encounters increased complexity for acceptable performance levels when the number of interfering signals and/or ISI lengths are moderate to large.

As an illustration of the M-algorithm as a tree-pruning algorithm, consider a tree made up of nodes and branches. Each branch has a weight or metric, and a complete path is a sequences of nodes connected by branches between the root of the tree and its branches. When applied as a short cut to the optimal MUD, each branch weight is a function of the signature signal of a certain transmitter, the possible bit or symbol value associated with that transmitter at that point in time, and the actual received signal which includes all the signals from all the interfering transmissions. The weight of each path is the sum of the branch metrics in a complete path. The goal of a tree searching algorithm is to try to find the complete path through a tree with the lowest metric. With the present invention the metrics of multiple complete paths are not calculated. Rather, the metrics of individual branches in a tree are calculated in the process of locating one complete path through the tree and thereby defines one unknown characteristic of each of the co-channel, interfering signals needed to decode the signals.

A MUD algorithm within the TurboMUD system determines discrete estimates of the transmitted channel symbols, with the estimates then provided to a bank of single-user decoders (one decoder for each user) to recover the input bit streams of all transmitted signals.

Two general types of multi-user detectors within the TurboMUD system are possible, namely those that provide hard outputs, which are discrete values, and those that provide soft outputs, which indicate both the discrete estimate and the probability that the estimate is correct.

However, single-user decoders operating on hard values, or discrete integers, have unacceptable error rates when there is a large amount of interference. The reason is that discrete integers do not provide adequate confidence values on which the single-user decoder can operate. These decoders operate better on so-called soft inputs in which confidence values can range from −1 to 1, such as for instance 0.75 as opposed to being either −1 or +1.

In an attempt to provide soft values that can then be utilized by a single-user decoder, the multi-user detector can generate these soft values. However the processing takes an inordinate amount of time. As a result, these systems do not produce real-time results. Since single-user decoders operate best on soft values, it is often times the case that the computational complexity for a robust MUD capable of generating these soft values makes it impossible to get a real-time result.

In an attempt to provide real-time performance by reducing the computational complexity of an iterative multi-user detector that can produce soft values, the prior art suggests algorithms for examining less than the total number of possibilities for each of the bits of data that are coming in from the multiple users. The "shortcuts" taken by this reduced complexity approach cause errors and combating these errors by increasing the number of iterations of the system completely nullifies any advantage.

Thus, while the MUD unit can generate soft values within the iterative cycle of the TurboMUD, the entire detection system is slowed down in generating these soft values. It should be appreciated that these soft values, rather than being integers which would be considered to be hard values, are real numbers, which in effect, permit a single user decoder to better error correct the output of the multi-user detector and thereby provide a more robust bit stream that will faithfully represent the original input for a given user.

Moreover, when dealing with hand-held communications units such as wireless handsets, the amount of processing within the device is limited, directly limiting the amount of computational complexity that is allowed. In order to provide real-time performance both at a cell site and the handset, it therefore becomes important to be able to reduce the amount of computational complexity and processing time so as to achieve realtime performance.

A further description of a TurboMUD system is described in an article by Paul D. Alexander, Mark C. Reed, John A. Asenstorfer and Christian B. Schlagel in IEEE Transactions on Communications, vol. 47, number 7, July 1999, entitled "Iterative MultiUser Interference Reduction: Turbo CDMA", wherein multiple users transmit coded information on the same frequency at the same time.

The growing demand for radio communications raises the need to optimize the performance while maximizing the capacity of wireless communications systems. To optimize performance in a multi-user environment either interference must be eliminated (convention), or the number of interfering signals must be kept below a pre-determined number (virtually all non-optimum MUD techniques) which is typically far less than multiuser theory would allow. Existing approaches fail to address all of these problems. What is needed is an efficient signal processing technique to improve the quality and spectral efficiency of wireless communications and better techniques for sharing the limited bandwidth among different high capacity users. As can be seen, attempts to make real-time processing multi-user processing have been frustrated by complex and sophisticated hardware and processing requirements. What is needed therefore, is a method and apparatus for allowing multiple users to operate in the same channel. Such a system should provide accurate cancellation of interfering signals while reducing complex processing.

SUMMARY OF THE INVENTION

The invention is devised in the light of the problems of the prior art described herein. Accordingly it is a general object of the present invention to provide a novel and useful apparatus and technique that can solve the problems described herein.

An object of the invention is to provide a high quality real-time receiver processing for multiple access systems, including overloaded systems, by implementing an iterative cooling enhanced tree-pruned MUD that includes confidence ordering, power-ordering, and a simple voting procedure to produce soft-values. On the first iteration, because confidence values are not yet available to the MUD (or, more correctly, all confidence values are equal), the user indices are ordered according to the received powers. On subsequent iterations, the user indices are ordered according to the confidence values determined by the single user decoders. This allows the MUD detector to operate on the most reliable symbols first, improving the likelihood that the pruning includes the correct path. Unlike prior art devices that tend to reduce or eliminate interferers, the present invention utilizes information from the interferers in order to provide a better likelihood of extracting the transmitted signals.

Thus, the present invention provides a solution to performance degradation in the form of a low-complexity Turbo-MUD and is aimed at detecting not only underloaded and fullyloaded channels as are virtually all MUD-based systems proposed in the public domain, but is particularly useful against overloaded channels. The voting soft metric production is done for every iteration, wherein the voting operator examines the final surviving states of the tree-pruned MUD algorithm, determines the most likely bit combination from the users via a simple voting procedure, and provides a soft-valued output for the bit combination similar to a probability. The soft-valued outputs may then be passed to a bank of soft-in/soft-out decoders, such as maximum a posteriori (MAP) single user decoders in a TurboMUD application. A pre-processing filter is used that operates for more users than dimensions. Therefore, this invention provides a low-complexity solution that approaches the performance of a full complexity TurboMUD, and operates on overloaded system in which the number of interferers is large.

While the full complexity TurboMUD requires prohibitive computational complexity, it provides a good method for removal of co-channel interference. A reduced complexity Turbo MUD suggested by the prior art still requires significant processing, but provides soft-values that are passed to the single-user decoders resulting in good performance.

Confidence ordering is most effective on the second and subsequent iterations. While effective on a first iteration, power ordering is not as effective as confidence ordering after the first iteration. Voting to produce soft metrics provides a way to simply calculations for soft metrics from hard metrics. The combinations of the three approaches (power ordering, confidence ordering, and soft-metric voting) are used together in the same TurboMUD system, combining their strengths for optimal performance.

Another object of the invention is a system that improves the performance degradation of tree-pruned TurboMUD systems that pass hard values from the MUD to the single-user decoders. The object system determines the symbols for which the majority of survivors agree and provides a soft reliability value to be passed to the single-user decoders. It remains a reduced-complexity approach, with complexity similar to M-algorithm tree-pruning TurboMUD, which means that the system can be implemented in real time.

A further object is a method that reduces the likelihood of improper pruning, thereby allowing for a reduction in the number of branches examined (and, therefore, a reduction in complexity) without negatively impacting performance. For the same complexity, the invention provides for superior performance when compared to other reduced-complexity tree-pruning-based MUD of the prior art.

Additional objects of the invention include making the system of sufficiently low-complexity that it can be implemented in real time. The present invention is compatible with overloaded systems as well as under and fully loaded, because it allows for a front-end filter that will operate well in an overloaded environment. This filter further improves the performance of the tree-pruning process of the MUD. The improved performance and low complexity of the present apparatus give service providers an apparatus that can allow more active transmitters (paying customers, users, phones, devices, etc.) without requiring more bandwidth or compromising performance.

This new method may be used to replace existing receivers without any modification to the transmitters, thereby allowing service providers to offer improved performance without changing the signaling method. For example, cellular phones can still operate with the additional features added to the base station or tower.

The present invention is an improvement on a multiuser detection processing procedure that, without causing degradation in quality of service or decreasing the total throughput, will allow for real time implementation in receivers designed for typical and high data rate multiple access communication. Specifically, the problem solved by this invention is the high computational complexity required by the tree-pruned iterative MUD to avoid the degraded performance caused by early incorrect pruning of the decision tree. In addition, this invention solves the problem of increased complexity typically needed to produce soft-values within the TurboMUD.

The subject of the invention disclosed in this application does not require that the signals correspond to any particular multiple access scheme or even that they are all of the same type, or come from a wireless system. For example, the present invention operates in the same manner on any set of digitally modulated interfering signals to include cellular CDMA systems, TDMA systems, FDMA systems, storage medium, wired MA systems such a cable modems, wireless local area network systems, or yet undetermined systems. For example, Spatial Division Multiple Access (SDMA) is generally a satellite communications technique that optimizes the use of radio spectrum and minimizes system cost by taking advantage of the directional properties of dish antennas and frequency reuse, and benefits from the bit processing described herein. The only requirement for viable operation of the present invention is that each signal source produces a signal with the information digitally modulated using a signature pulse or finite duration signal of some sort. While CDMA is described for illustrative purposes to explain the invention, the specific example of CDMA is merely for ease of understanding. The present invention is directed to any other form of digital communication or signal storage methods by simply replacing the words in the CDMA discussions "signature sequence" with "signature signal" or "signature pulse" and replacing the words "CDMA signal" with "digitally modulated signal".

In summary, the described system provides real-time performance for iterative multi-user detectors, such as TurboMUDs, which are used to separate simultaneous transmissions on the same frequency, by permitting the MUD to use a less computationally intense, fast-processing algorithm and to correct for errors caused by the fast processing. In order to reduce the errors, a power confidence order and voting system are coupled to the input and output of the multi-user detector within the iterative system.

Yet a further object is to decode co-channel, interfering signals at a receiver with a tree based on a decoding algorithm wherein on a first iteration strongest received signal as determined by a parameter estimation unit are assigned in descending order of signal strength. By a first power ordering, a low complexity suboptimal search of the tree will be more likely to report the correct answer. Subsequent iterations utilize confidence ordering to create a higher likelihood of maintaining the correct path when computing subsequent tree decisions.

A further feature of the present invention is that it works equally well using mixed rate communication systems such as IS95, wherein the user chooses the transmission rate. The parameter estimator that handles the differing transmission rates passes along the information to the present system.

An object of the invention is an advanced receiver apparatus for processing signals from multiple users with interfering signals, comprising an ordering unit for ordering users indices, wherein on a first iteration ordering is based on received signal power, and wherein on subsequent iterations ordering is based on confidence values. A multi-user detector coupled to the ordering unit producing a plurality of surviving states. A voting unit coupled to the multi-user detector for processing the surviving states and generating a set of soft estimates of channel symbols. A decoder section coupled to the voting unit and the multi-user detector, wherein the decoder section processes the soft estimates of channel symbols to produce a final output on a final iteration, and wherein the decoder produces the confidence values for intermediate iterations.

A further object of the advanced receiver apparatus comprises a parameter estimation unit coupled to the ordering unit and the multi-user detector for determining and storing various parameters associated with each of the interfering signals present in the received signal. Also, wherein the decoder section is a bank of soft input soft output (SISO) decoders, and wherein the SISO decoders may be selected from the group comprising: maximum a posteriori (MAP) decoders and soft-output Viterbi algorithm (SOVA) decoders. A further object is where the multi-user detector uses an algorithm selected from the group comprising an M-algorithm, T-algorithm, MT-algorithm, and tree pruned versions of the MAP, Log-MAP, and Max-Log MAP. Also, wherein the filter is selected from the group comprising a whitening matched filter, a bank of matched filters, and any bank of orthogonal filters that span the space defined by the collection of interfering signals.

A further object of the advanced receiver apparatus comprises a means for determining the final iteration, wherein the means is a fixed number of iterations or an allowable difference between previous confidence values and current confidence values.

An object of the invention is a method for processing a plurality of receiver signals from multiple users, comprising the steps of processing the receiver signals in a front end to generate a digital signal, performing parameter estimation of the digital signal, ordering instructions for instructing the tree in the MUD, wherein the ordering is a power ordering on a first iteration, and confidence ordering on subsequent iterations, detecting a plurality of solutions by maintaining multiple surviving paths each one corresponding to a complete set of bit streams, one bit stream for each interfering signal, voting on the survivors to generate a single set of a soft-valued outputs, decoding the soft-valued outputs to form a set of confidence values, repeating the steps of confidence ordering, detecting, voting, and decoding until a final state is obtained, and outputting data estimates corresponding to a set of data bit streams, one bit stream for each interfering signal.

A final object of the invention is a receiver system for processing signals from multiple users with interfering signals, comprising a front end unit for receiving and processing incoming receptions, with a parameter estimator unit coupled to the front end unit for processing the receptions. There is a filter section coupled to the parameter estimation unit and an ordering unit coupled to the filter section for ordering users indices, wherein on a first iteration ordering is based on received signal power, and wherein on subsequent iterations ordering is based on confidence values. There is a multi-user detector coupled to the ordering unit producing a plurality of surviving states with a voting unit coupled to the multi-user detector for processing the surviving states and generating a set of soft estimates of channel symbols. A decoder section is coupled to the voting unit and the multi-user detector, wherein the decoder section processes the soft estimates of channel symbols to produce a final output on a final iteration, and wherein the decoder produces the confidence values for intermediate iterations.

Still other objects and advantages of the present invention will become readily apparent to those skilled in this art from the following detailed description, wherein we have shown and described only a preferred embodiment of the invention, simply by way of illustration of the best mode contemplated by us on carrying out our invention. As will be realized, the invention is capable of other and different embodiments, and its several details are capable of modifications in various obvious respects, all without departing from the invention.

BRIEF DESCRIPTION OF THE DRAWINGS

The present invention will be readily understood by the following detailed description in conjunction with the accompanying drawings, wherein like reference numerals designate like structural elements, and in which.

DESCRIPTION OF THE PREFERRED EMBODIMENT

The methods and embodiments of the confidence ordered soft MUD disclosed herein enable implementations of advanced receiver processing providing high quality real-time processing for multiple access systems operating with interferers. The preferred embodiment is just an illustration of the digital processing technique that is applicable to many variations and applications all within the scope of the invention. A description of multiuser processing is detailed in the related application METHOD FOR OVERUSING FREQUENCIES TO PERMIT SIMULTANEOUS TRANSMISSION OF SIGNALS FROM TWO OR MORE USERS ON THE SAME FREQUENCY AND TIME SLOT, application Ser. No. 09/923,709 filed Aug. 7, 2001.

Figure 1:
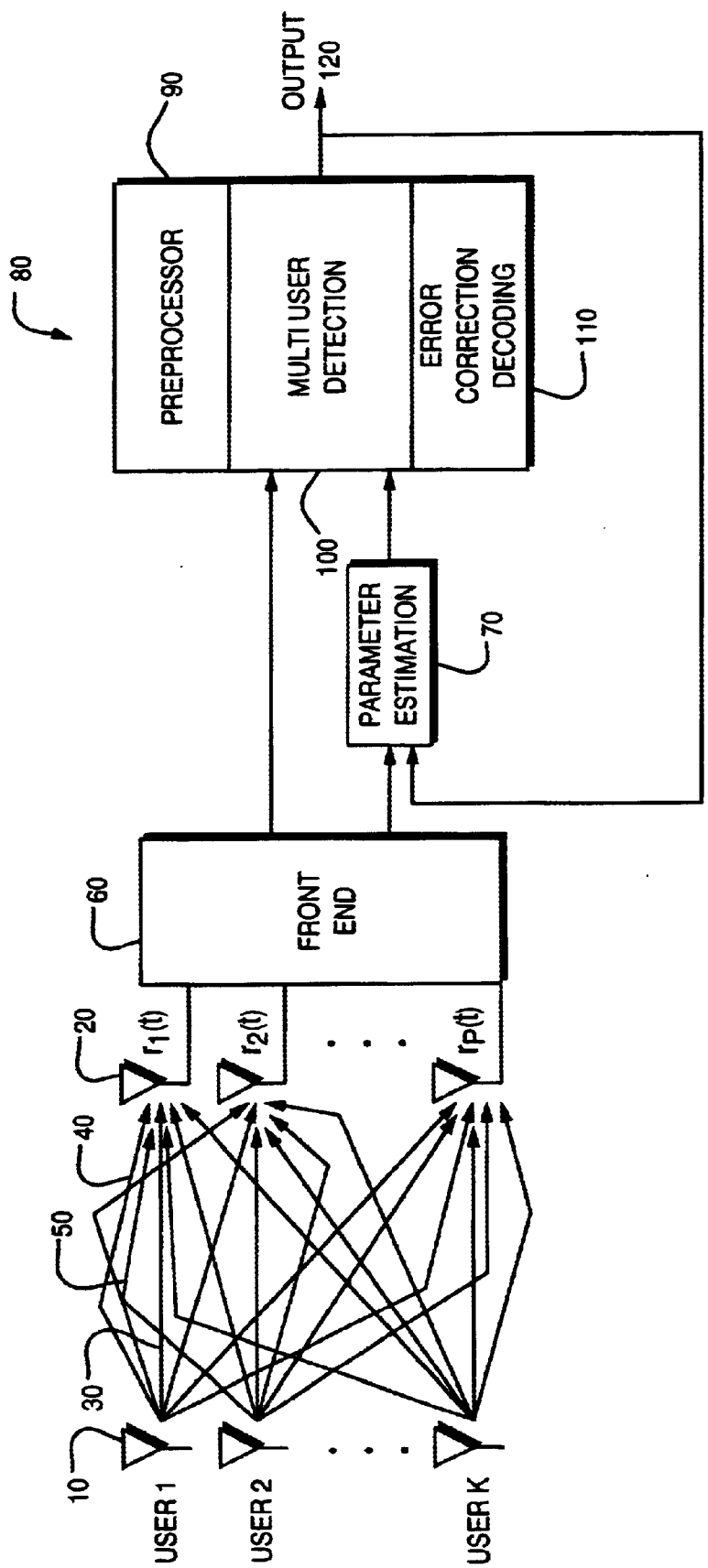
FIG. 1 is an illustration of wireless reception in a multi-user environment and subsequent processing in a MUD scheme.

Referring to FIG. 1, a number of users (1-K) generate signals that are sent by transmitters 10 into free space. The various signals are received at antennas (1-p) 20, wherein there is one signal for each polarization feed. The signals represent directly received signals 30, as well as multi-path signals 40 from the same user, and interfering signals 50 from other users.

The plurality of signals from each antenna 20 is processed in a front end unit 60. The front end unit 60 downconverts the higher frequency signals into baseband signals for ease of processing. The baseband signals are digitized by analog to digital converters (A/D). The front end cooperates with the parameter estimation unit 70 to retrieve needed information for the signals such as relative received timing offsets, carrier phase, frequency offsets, received amplitudes, and multipath structure for each of the interfering signals present in the received signal.

The MUD element 80 consists of functional blocks that process the digital data and extract the user signals. The pre-processor 90 converts the baseband digital data into the proper format for further processing according to the desired detection scheme. The format is typically one measurement per 'dimension' per symbol. An example of this processing is a bank of matched filters. The multi-user detection stage 100 is detailed herein and cooperates with the error correction decoding (ECD) for iterations of the TurboMUD processing.

The output of the MUD element 80 is returned for a number of iterations with the parameter estimation unit 70 that returns information to the MUD 80 for use in subsequent processing. When the K output bit streams 120 have reached a certain level of processing as described herein, they are forward to the output stage (not shown).

Figure 2:
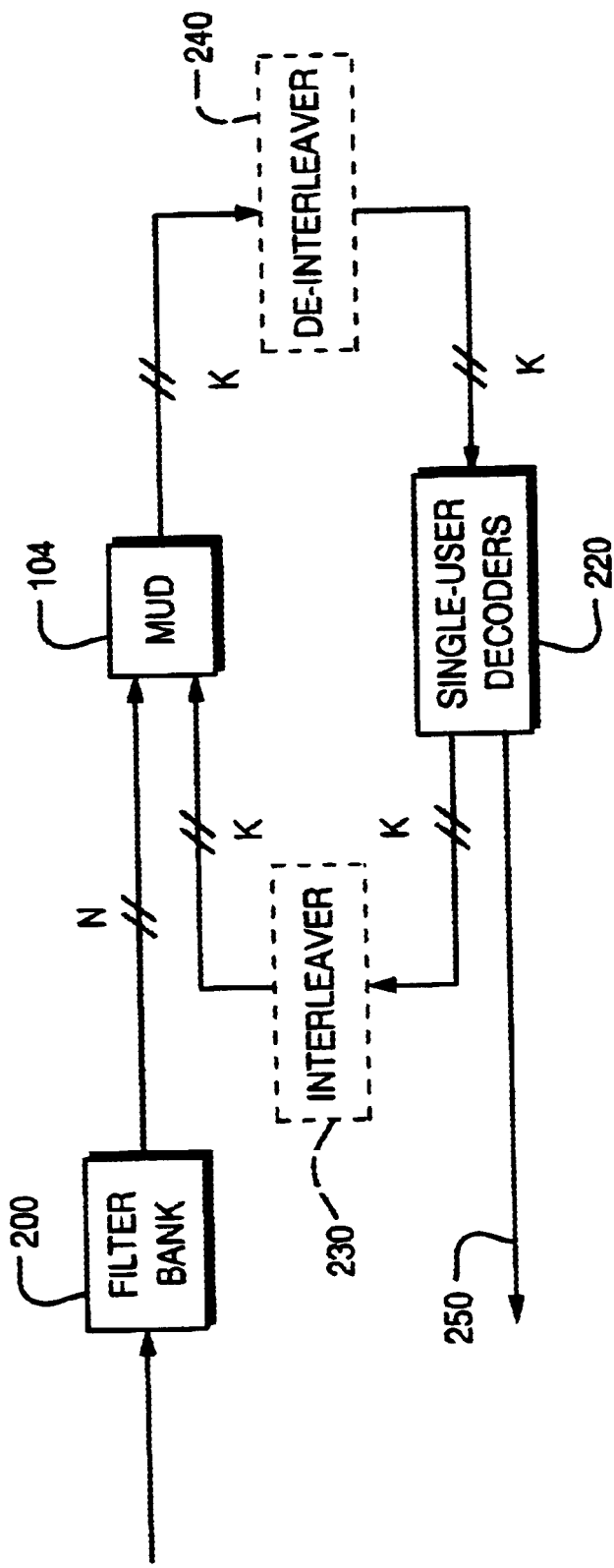
FIG. 2 shows a block diagram perspective of the prior art conventional MUD system illustrating the iterative processing for each decoded symbol of each user.

Referring to FIG. 2, which shows a prior art iterative MUD algorithm such as is representative of the approaches used to incorporate a turbo decoding approach into joint MUD/FEC (Forward Error Correction) decoding specifically to reduce the complexity of the system. It should be appreciated that there are two embodiments of the subject invention, namely an iterative embodiment and a non-iterative embodiment. The iterative embodiment is described herein while the non iterative merely runs a single cycle through the process.

A parameter estimation unit (not shown) provides the input to the Filter 200. In a TurboMUD system, decoding and confidence information is passed between the MUD 210 and single-user (SU) decoder components 220. Maximum a posteriori (MAP) decoders (or approximations of MAP decoders) are well known to those in the art and are used for both the MUD and SU decoders so that soft output information is available if desired. The detector 210 assumes knowledge of various parameters such as relative received timing offsets, carrier phase, frequency offsets, received amplitudes, and multipath structure for each of the interfering signals present in the received signal.

MAP decoding is known in the prior art and further described in C. Schlegel, Trellis Coding, IEEE Press, 1997; Robertson, Villebrun and Hoeher, "A Comparison of Optimal and Sub-Optimal MAP Decoding Algorithms Operation in the Log Domain," ICC95; Hagenauer, and Hoeher, "A Viterbi Algorithm with Soft-Decision Outputs and its Applications," Globecom 89; Pottie and Taylor, "A Comparison of Reduced complexity Decoding Algorithms for Trellis Codes," J Sel. Areas in Comm Dec 1989. The iterative turbo principle, on which TurboMUD is based, is described by Berrou, Glavieux, and Thitimajshima, "Near Shannon Limit Error-Correcting Coding and Decoding: Turbo-Codes (1)," ICC 93; Berrou and Glavieux, "Near Optimum Error Correcting Coding and Decoding: Turbo-Codes", Trans on Comm, Oct 1996; and Wang and Kobayashi, "Low-Complexity MAP Decoding for Turbo Codes", Vehicular Technology Conference 2000]. Turbo-MUD approaches are described in, for example, Alexander, Reed, Asenstorfer, and Schlegel, "Iterative Multiuser Interference Reduction: Turbo CDMA," Trans on Comm, July 1999; Poor, "Turbo Multiuser Detection: An Overview, "ISSSTA 2000; and Wang and Poor, "Iterative (Turbo) Soft Interference Cancellation and Decoding for Coded CDMA", Trans on Comm, July 1999.

The received measurement from the parameter estimation unit (not shown) is passed to a filter, 200, such as a whitening matched filter bank or bank of matched filters. The parameter estimation unit is known in the art. The whitening filter tries to 'spread' or 'warp' the signal so that it is easier to distinguish between signals by changing the axes or point of reference. Supersaturated or overloaded conditions occur when the number of users K exceeds the number of dimensions N. Number of dimensions is determined by the physical parameters of the system. There are other filters being developed that handle overloaded conditions, and the present invention is easily adaptable to the different filters.

The filtered signal is then passed into a MUD detector 210. In the optimal case, the MUD detector 210 is a full-complexity MAP detector. Suboptimal reduced complexity MAP-based approaches are known in the relevant art.

The MUD detector 210 passes soft decisions in the form of reliability, or confidence, measures to the single user decoders 220. The reliability measures are presented with one associated with each symbol of each user to the bank of SU decoders 220. If the signals were transmitted with interleaving, the reliability measures from the MUD 210 are first passed through a deinterleaver 240 and passed on in shuffled form to the SU decoder 220. Shuffling refers to same values but changes the placement or presentation of the values.

The single user decoders 220 calculate conditional probabilities, one for each decoded symbol of each user, and output them as confidence values back to the MUD 210.

In one embodiment, there is a bank of error correction decoders that provide soft output or restore values associated with prior probabilities. Viterbi decoders can be used, but generally outputs hard values. Soft input soft output decoders, such as MAP or soft-output Viterbi algorithm (SOVA) decoders, are generally more efficient with respect to the present application.

If interleaving was present in the transmitter, an interleaver unit 230 performs interleaving. The time-shuffled conditional probabilities are input back to the MUD algorithm 210. Interleaver 230 and de-interleaver 240 are optional elements used when interleaving is present in the transmitter. When the transmitter employs interleaving it changes the presentation of the values but not the values themselves. IS-95 is the standard for CDMA and is an example of interleaved signals.

The information between the MUD and the SU decoders repeats in subsequent iterations until an asymptote is reached or the desired performance level is attained. At that point, estimates of the data sequences for all active users are output 250. Operation then commences for the next block of data, repeating the process described above.

The number of iterations for processing between the MUD and the SU decoders can be set to a fixed counter, an asymptote is reached, or by checking if there were significant changes to the data from the last iteration. Once finished with the intermediate iterations, the data from the SU decoder can be output 250 as final estimates of what the user sent.

As described herein, prior art TurboMUD suffers from limitations with respect to real-time processing of data in a multi-user environment due to the complexity of processing a large number of possibilities in the tree.

Figure 3:
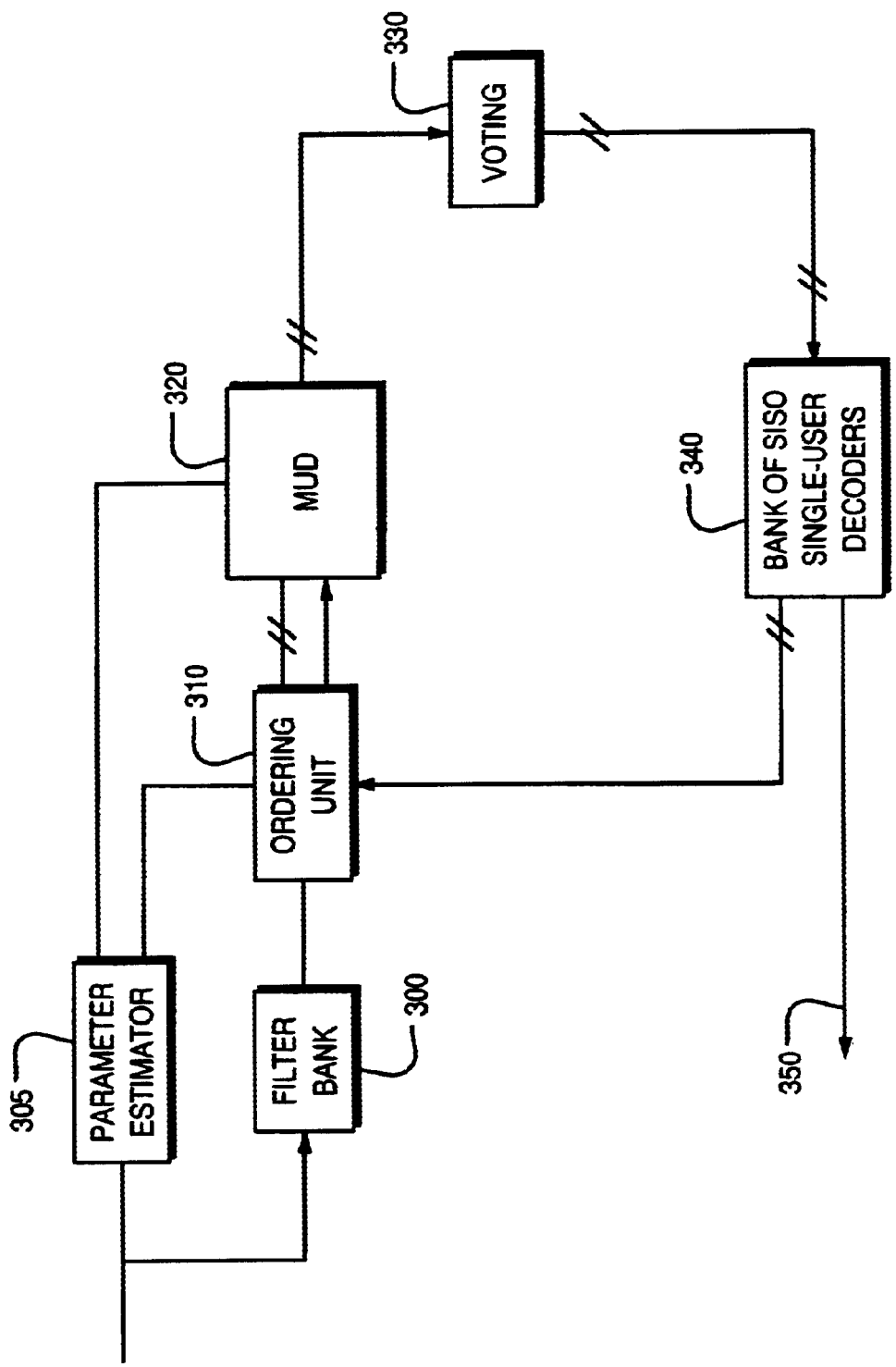
FIG. 3 is a block diagrammatic view of the iterative MUD system with the order unit to rank user power in a first iteration, confidence in subsequent iterations, and the voting box used to convert the hard outputs of the MUD to soft-valued inputs to the decoders for subsequent iterations

FIG. 3 depicts one embodiment of the present invention showing the inventive subject matter. This particular embodiment encompasses a data-whitening front end filter bank 300, an ordering unit 310 that re-orders users on a per-symbol basis based on received signal power in the first iteration and confidence in subsequent iterations, any tree-pruned MUD 320, a voting soft-metric production unit 330 that examines the bit estimates in the surviving sequences determined in the MUD 320 and produces a soft reliability values, and a bank of soft-input, soft-output single user (SU) decoders 340. The components are connected in a turbo configuration, and it is assumed that interleaving and de-interleaving are not present. The extension to a system with interleaving is an obvious variation by adding a deinterleaver after the MUD 320 and an interleaver after the Decoders 340.

The apparatus shown in FIG. 3 is now described in more detail. The received measurement vector representing the received downconverted sample signal is passed through a data whitening filter bank 300 and also to the parameter estimation unit 305. The filter 300 can either be a filter designed for an overloaded system to pre-process a signal comprised of more transmissions than orthogonal channels, or a whitening filter that is appropriate for fully loaded or underloaded systems. The filtered signal is then passed to the MUD 320.

For each symbol interval in the first iteration, the ordering unit 310 re-assigns the user indices according to decreasing received signal strength. The tree-pruned MUD builds a decision tree starting with user 1, the user 2, all the way up to user K. The ordering unit decides which user should be user 1, which should be user 2, and so on. The ordering on the first iteration establishes an initial ranking according to the greatest signal strength for that group of signals.

The parametric estimation unit estimates and tracks the signal strength or power of each individual signal as well as various other signal parameters for each of the transmitted signals, such as carrier phase, carrier offset, clock, etc. This power information is forwarded to the ordering unit 310, which re-orders the signal indices and forwards the re-ordered parameter data 370 to the tree pruned multi-user detector unit 320. The decision tree is constructed by placing the highest power user-related nodes in the first level of the tree nearest the tree root, the second-highest-power user-related nodes in the second level of the tree, etc. By building the decision tree with the highest power signal first, directly corresponding to calculating the decision metric term by term, the first term contains measurements and information relating to the highest power user. A reduced search of a decision tree built in this manner is more likely to include paths (and nodes) that contain the 'correct' answer.

In other words, due to the advantageous power ordering in the decoding tree, the low complexity suboptimal search of the tree will be more likely to include the branches containing the correct answer, thus ultimately resulting in the correct answer more often than when power ordering is not used.

For each symbol interval in subsequent iterations after the power ordering, ordering unit 310 examines the conditional probabilities (reliability values) calculated by the single-user detectors 340 and orders the users in decreasing values of likelihood of correct detection. In effect, the users are renumbered so that, for each symbol interval, the MUD detector 320 can operate on the symbol for the most reliable user for that interval, first, improving the likelihood that the pruning is correct.

The ordering information may change from symbol interval to symbol interval within the block of data under consideration. The re-ordered user indices and corresponding confidence measures 370 are passed to the MUD 320 along with the vector of whitened signals from the received signal 370. The MUD 320 may contain any tree-pruned MUD, such as the M-algorithm based approach or a pruned tree based on MAPMUD. The system 'remembers' past output bit values in the event that the MUD determines that the ordering was incorrect and the processing has to return to a known state.

The MUD 320 passes the surviving symbol combination possibilities (M survivors for M algorithm, for instance, or several most likely, for other approaches) to the voting section 330.

The voting procedure in section 330 is a novel improvement over generic TurboMUD procedure. A further description of the voting process is detailed in the related application entitled VOTING SYSTEM FOR IMPROVING THE PERFORMANCE OF SINGLE-USER DECODERS WITHIN AN ITERATIVE MULTI-USER DETECTION SYSTEM application Ser. No. 10/055,155.

MUD detector 320 passes the surviving symbol combination possibilities in terms of M survivors to the voting unit 330. The voting procedure may be applied to synchronous or asynchronous systems, but for simplicity, only the synchronous case is described. For each symbol interval, MUD 320 determines the likelihood of some number of symbol combinations from the users, one from each user. For example, the MAP and ML MUD determine the likelihood of $2^{(\#of\ users)}$ combinations. The M-algorithm-based approaches then calculate the likelihood of M combinations. Each of the M combinations represents a best guess as to what a bit is for each user, e.g. each of the M surviving paths corresponds to one possible solution that determines one bit value for each interfering transmission.

Thus, for the symbol interval, each survivor of unit 320 contains a symbol estimate for every user, +1/−1 for BPSK, for instance. The voting procedure is then done for each symbol interval, i.e. each bit. For each user, the estimate from every survivor for that user is examined and included in a vote. After all survivors are examined for the given user, the vote tally is divided by the total number of survivors, to provide a normalized, soft estimate of the symbol or bit for the user. The process is done for each user and all symbol intervals and provides K streams of reliability measures or soft estimates of the symbols, one stream of soft symbol decisions for each user is passed in time-ordered form to a bank of single-user decoders 340. Single user decoders 42 use the information as a priori information and output conditional probabilities that are then fed back to the ordering unit 310. If the MUD is based upon the MAPMUD, then these conditional probabilities are also passed to the MUD 320.

In operation, rather than requiring the multi-user detector to provide the soft outputs and thereby increase the computational complexity and processing time, hard outputs from the multi-user detector are tolerated by converting these hard outputs into soft outputs through the voting algorithm. In one embodiment the voting algorithm analyzes, for each user, the various guesses from the multi-user detector as to what the particular bit is, either +1 or −1.

It is understood that the output of the multi-user detector is a series of best guesses as to what the particular decoded bit should be. These guesses are the result of the application of various assumptions in the multi-user detection algorithm based upon prior expected knowledge of the signals. The voting algorithm for each user averages the results of a predetermined number of best guesses (for instance, M best guesses for an M-algorithm implementation) and provides that average as a real number.

Figure 4:
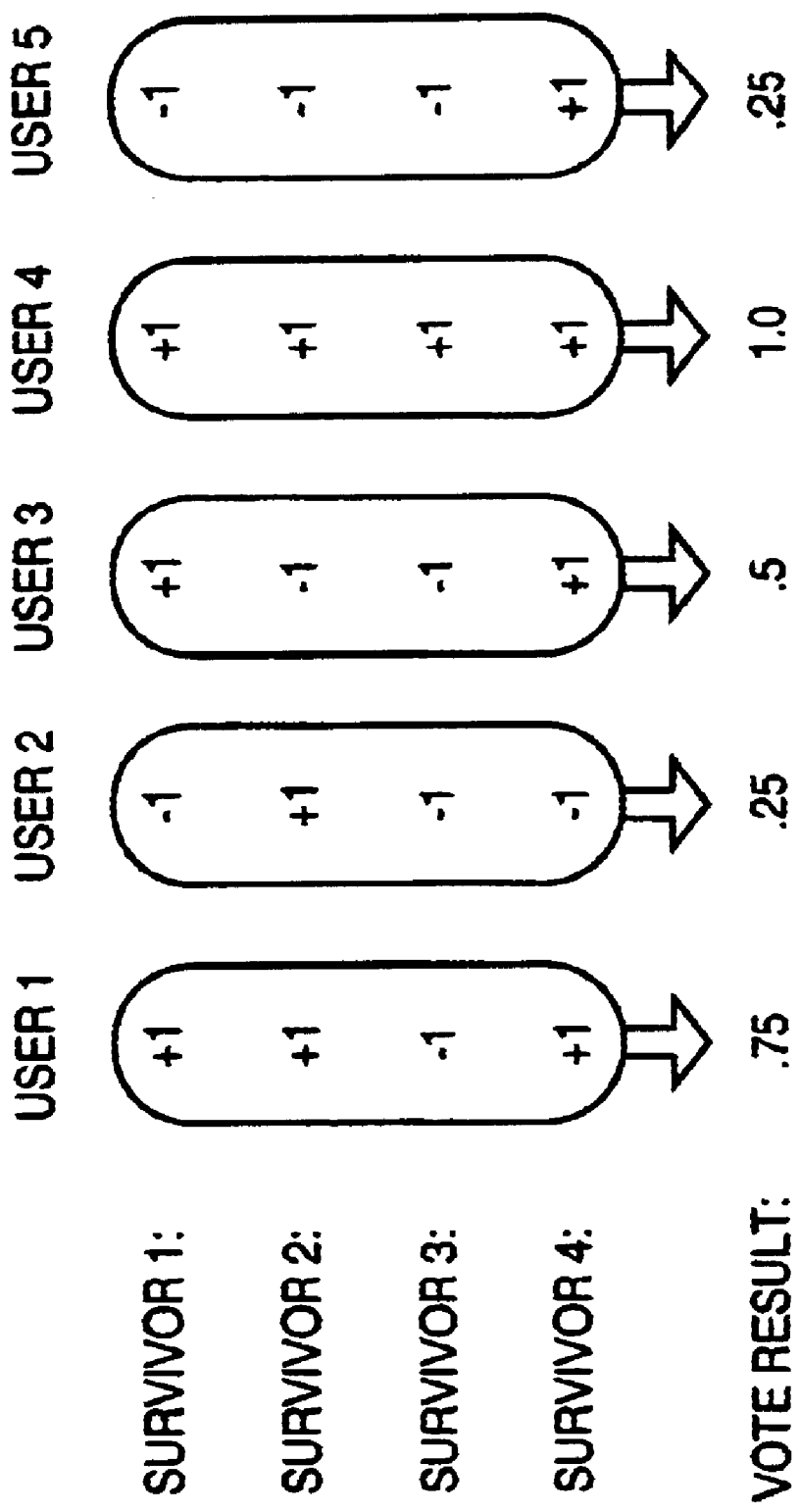
FIG. 4 is a table illustrating the voting process for several users using survivor probabilities.

Referring to FIG. 4, an illustrative example is provided, wherein there are 4 survivors and 5 users and BPSK symbols are assumed. One symbol interval is shown. It will also be assumed in the example that soft values will range from 0 to 1, with 1 corresponding to a "certain" +1 and 0 corresponding to a "certain" −1. It can be seen that the voting is done for each user, by examining the estimates for the users provided by the survivors.

For instance, assume User 1 has the following guesses as to the particular bit: +1, +1, −1, +1. Then the average or vote result using the probabilities associated with the guesses is 0.75 and represents the confidence factor for the particular bit being a +1. It will be appreciated that the integers that are averaged are the hard outputs of the multi-user detector. This obviates doing a soft output calculation in the MUD itself, which takes an inordinate amount of time.

It is appreciated that in convolutional decoders, it is the job of the decoder to establish that a given bit sequence is likely to predict the next bit level. For example, if it is expected that the bit sequence should be +1, +1, +1, −1, +1, then probability of the next bit being a +1 is very high and the decoder therefore outputs for that particular bit a +1 with a certain degree of confidence, even if the detected bit was a −1, thereby correcting a detection error cause by channel interference.

As a result of the processing by the TurboMUD, there are a number of survivors, here labeled Survivor 1, Survivor 2, Survivor 3 and Survivor 4. These survivors correspond to the best guesses for a given incoming bit after having been processed by the TurboMUD through one of a number of its internal algorithms.

The best guesses as to which character should be for User 1 in Column 1 are: +1, +1, −1, +1. A simple averaging of the associated probability values gives a vote result of 0.75. It is this real number that is used by the follow on single-user decoder.

Thus in the illustrated example, there are 4 survivors and 5 users and BPSK symbols are assumed. One symbol interval is shown. It will also be assumed in the example that soft values will range from 0 to 1, with 1 corresponding to a "certain"+1 and 0 corresponding to a "certain" −1. It can be seen that the voting is done for each user, by examining the estimates for the users provided by the survivors that were determined in the MUD detector.

The problem with hard-input/hard-output convolutional decoders is that there is no weight given to gray areas between +1 and −1 as to the probability that the particular bit is correct. A soft value of a +1 times a particular confidence value is more useful in the convolutional decoder coming to the correct result than the prior hard-input method.

With the soft value output of the voting algorithm being applied to the single-user decoder, the convolutional decoder can take into account real numbers as opposed to integers in deciding what a given bit should be.

The soft input is provided to a single-user detector in a non-computationally intense way. This means that soft values are applied to the decoder without having to generate a soft output from a multi-user detector. The result of not having to generate a soft output for multi-user detectors means that close to real time decoding is possible, since the voting algorithm is a simple averaging process requiring little computational overhead.

It will be appreciated that the improved performance of the single user decoder can also be utilized to improve the performance of the MUD. The output of the single-user detector, having been improved through the utilization of the aforementioned voting algorithm, can be utilized in a feedback loop to the multi-user detector to improve its selection process utilized.

Note that a multi-user detector system for a coded signal, such as a TurboMUD, analyzes the incoming bit streams with respect to both the relationship among users during one bit interval, and the relationship of bits within a bit sequence for one user. Since the output of the single-user decoder is correcting the bit sequences for each user, the correct bit sequences for some users (corresponding to high confidence values determined by the SU decoder) when known by the multi-user detector results in more accurate detection of the incoming bit streams for other users (corresponding to low confidence values) during each individual bit interval. Moreover, given more accurate detection by the multiuser detector, each single user decoder examines and corrects the estimated data sequence for one user, and is more effective in error correction as a result of the more accurate input.

For example, assume that for a given bit interval, the soft decision value for a particular user is, for instance, 0.5 (no confidence in a +1 or a −1) for that particular bit. Taking this confidence value and passing it to the single-user decoder might result in a soft decided output of 0.6. By feeding back this soft value to the multi-user detector, for the next time interval the confidence value form the voting algorithm may indicate a 0.7. Using this in the multi-user detector, on the second iteration the soft decision value may approach 0.9 (high confidence of a +1).

The result of the iterative processing improves the performance of the MUD processing. As a result, the final output data streams, which are the main concern of the intended listeners, are more accurate.

To quantify the type of improvement utilizing the voting algorithm, the soft output from a MUD provides a computational complexity several orders of magnitude higher. The processing time is cut by as much as one third and is often times cut in half when utilizing the present inventive system.

The voting system provides confidence values on a symbol-by-symbol or bit-by-bit basis for the estimates made by the multi-user detector, with the soft decision values then being utilized as soft inputs to a bank of conventional single-user decoders. The use of soft inputs improves the performance of each of the decoders when compared to the performance that would be the result if the decoders were driven directly with the output of a hard-output MUD within a TurboMUD system. Each single-user decoder is a soft-input, soft-output decoder which operates on real number inputs as opposed to discrete integers so that the output of the decoder is much less error prone. The soft output of the decoder is also utilized to improve the multi-user detection process by coupling confidence values from the single-user decoder to the multi-user detector to allow it to recompute its estimates of the incoming signal. Examples of soft-input, soft-output algorithms are the Soft Output Viterbi Algorithm (SOVA) decoder proposed in Hagenauer, and Hoeher, "A Viterbi Algorithm with Soft-Decision Outputs and its Applications," Globecom 89, the BCJR algorithm proposed in L. R. Bahl, J. Cocke, F. Jelinek, and J. Raviv, "Optimal decoding of linear codes for minimizing symbol error rate", IEEE Trans. Inform. Theory, vol. 20, pp. 284–287, 1974 and the several algorithms discussed in Robertson, Villebrun and Hoeher, "A Comparison of Optimal and Sub-Optimal MAP Decoding Algorithms Operation in the Log Domain," ICC95.

In the non-iterative embodiment, no subsequent iterations are performed. Rather, the estimates of the data sequences for all users are output from decoder 340 on output line 350.

Figure 5:
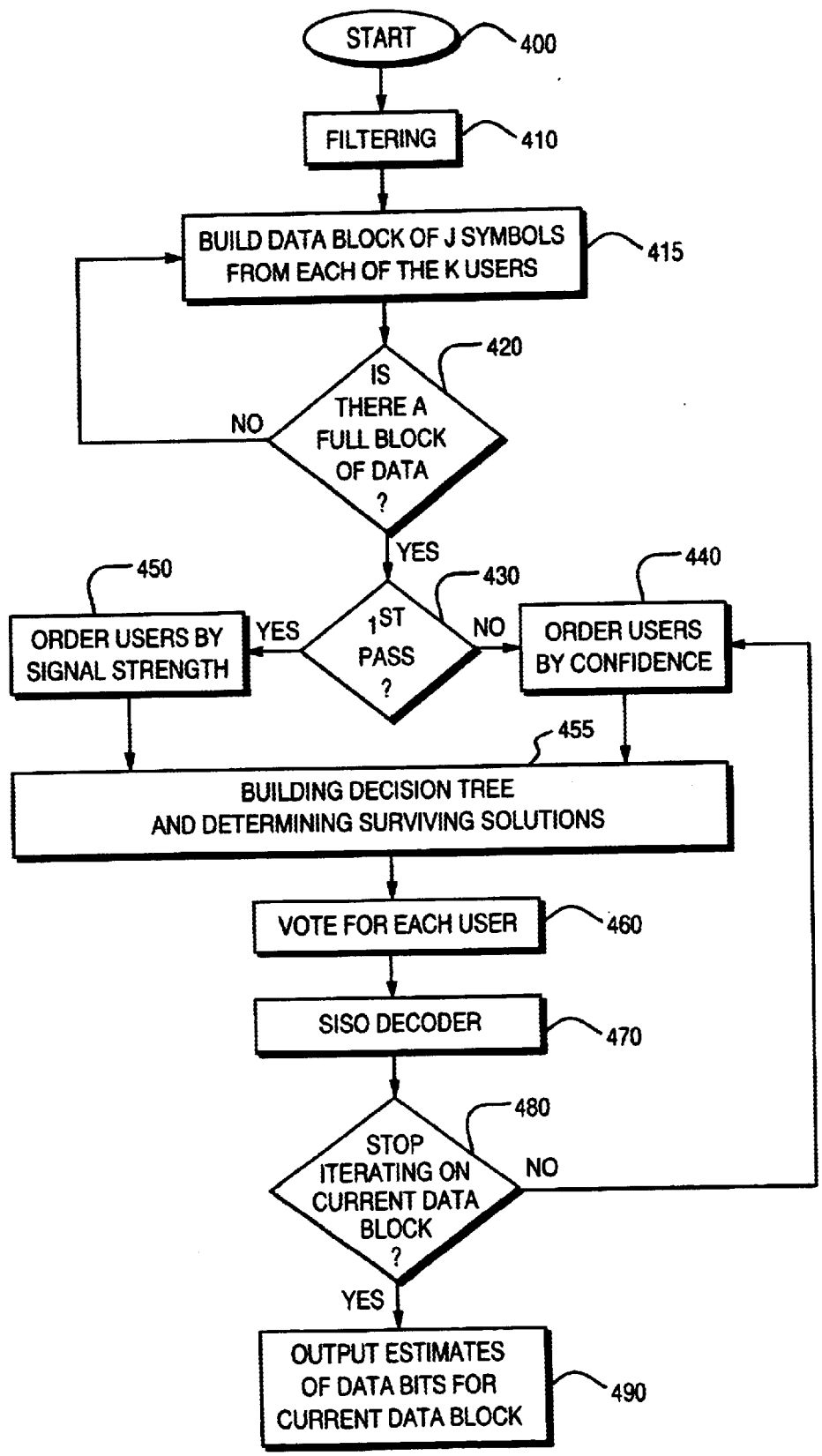
FIG. 5 is a flow chart showing the steps in the process for the power/confidence ordering and voting procedures.

Referring to the flow chart of FIG. 5, the starting point 400 begins with receiving the discrete signal having been processed by a front end unit (not shown) and parameter estimation information (parameter estimator not shown). The front end performs downconversion, filtering and sampling of the analog signal from the antenna as described in the prior art. The front end unit is coupled to the parameter estimation unit that provides the input to the TurboMUD system. The parameter estimation unit also measures the necessary processing information such as signal strength.

The input signal is processed by a bank of filters to condition the signal for overloaded or under-loaded conditions. A whitening matched filter bank is used in the preferred embodiment, thus the signal is 'warped' or spread-out into the space which reduces the effects of other users in close proximity and lowers the effects of 'bleeding' on the decision tree.

A loop is used to build a data block of J symbols from each of the K users per step 415, wherein step 420 checks to see if there is a full block of data. If there is a full block of data, the processing continues to step 430. If the data block of J symbols for each of the K users is not yet full, the loop continues until the data block if full. Once the data block is full, the processing proceeds to step 430.

Step 430 checks whether this is a first iteration, which is easily accomplished by a simple counter or whether the data has confidence values. If it is the first iteration, the next step 450 is ordering of users by power, which ranks the users according to the received signal strength. The data block at this stage is a set of real valued discrete measurements, one associated with each whitening filter and bit time pair. There is also book-keeping information from the ordering unit listing the users in preferred order along with their identifying parameter values. The signal block and user/parameter list is then available to the MUD for forming the decision tree 455.

If it is not the first iteration, there are confidence values, and the ordering unit orders by confidence 440 based on the information from the decoders that is the soft data.

The next step 455 is building and pruning of the decision tree in the MUD. The calculation of the metric values on each branch of the decision tree 455 is based on knowledge of the user's interference properties as provided by the parameter estimation unit and a guess as to what the user could have sent (the users possibilities). There are several algorithms such as a MAP based M-algorithm that is known to process the decision tree and it is up to the implementation based on desired requirements. Other algorithms include T-algorithm, or MT-algorithm, versions of the Log-MAP, or Max-Log MAP detectors.

The output of the MUD decision tree is a set of surviving best sequence estimates with discrete values over users and time. The voting step 460 is performed on each symbol in the data block for each user and evaluates the estimates of all survivors and performs an averaging function. The output of the voting process is a matrix (K users x J time or symbol intervals) of soft decision values with each matrix element corresponding to a channel symbol from a particular user at a particular time interval.

The next step 470 is to use the matrix of confidence values in the bank of SISO decoders, in which each decoder forms a decision tree for one user using convolutional code for that user. Using a counter over users, either parallel or serial, a decision tree is formed by taking a row of matrix soft values and creating a coding decision tree for that row.

The output of 470 is another matrix (K×J) of soft values that corresponds to conditional probabilities of the channel symbols. It is corrected bit or symbol decisions, e.g. one stream of real values (soft data) for each user that goes to a condition block 480 for determining whether the output can go back to the ordering unit or stop iterative processing. It should be readily understood by those skilled in the art that the two dimensional K×J matrix passed throughout is merely an example, and the values can be adapted into any two-dimensional form either transposing the elements or including other elements within the array such as zeros as unused or place-holding elements that change the size of the array.

There are several ways to terminate the iterations. There can be a fixed counter value or the system can track the number of changes relative to prior iteration, or a combination thereof. It is known that several iterations, such as three or four, establish a fairly high reliability level and further processing yields only a slightly higher level. This counting for several iterations and stopping will yield satisfactory results in most conditions. Alternatively, the number of changes that take place due to re-ordering and recalculations of confidence values by the SISO decoders can be tracked and when the number is minimal or even zero, the processing can stop and the data output 490 can be performed. The output is the estimates of the data bits (not channel bits) that correspond to the original uncoded data bits going into the system at each transmitter.

If the processing of the current block of symbols is not yet completed, the soft value matrix containing conditional probabilities is transported back to the ordering unit where it is checked for first pass, and then ordered by confidence.

It is readily apparent that the combination of a first iteration power ordering followed by a voting procedure using soft values produces a low complexity soft Turbo-MUD that is useful in a variety of applications and with varied methods for implementing the system, and is therefore not limited to the embodiments presented herein. A wide range of variations and modifications may be made without departing from the scope of the present invention.

While the operation of the subject system has been described in terms of a wireless communications network, it has application to any situation in which digitally encoded interfering signals exist. Thus, the subject system has application to cable networks in which multiple users are seeking to communicate with a head end system simultaneously.

In another embodiment, the present system is incorporated into reading storage mediums, such as computer hard drives, and to separate signals from adjacent tracks when the read head overlies portions of adjacent tracks. With the increasing density of storage devices such as hard drives, memory cards, and various storing discs, there are significant commercial advantages and incentives to place more data on smaller spaces and being able to quickly and reliably extract the data. The processing schema of the present invention is easily tailored to such an application as the data from the compact tracks of the recorded medium from the storage devices resembles wireless data bits and requires processing to promptly access and retrieve the desired data. The MUD processing with respect to the storage devices refer to the plurality of signals received when the optical head picks up the signals of the adjacent tracks of the storage mediums. The tight spacing between the tracks creates a multiple user detection problem involving the processing of the desired track signal from the other received tracks.

Thus the reference to a receiver apparatus in the specification and claims is intended to be taken in the broadest context and include wireless as well as terrestrial communication systems as well as receiver devices in disc drive systems.

Numerous characteristics and advantages have been set forth in the foregoing description, together with details of structures and functions of the present invention, and some of the novel features thereof are pointed out in appended claims. The disclosure, however, is illustrative only, and changes may be made in arrangement and details, within the principle of the invention, to the full extent indicated by the broad general meaning of the terms in which the appended claims are expressed.

The objects and advantages of the invention may be further realized and attained by means of the instrumentalities and combinations particularly pointed out in the appended claims. Accordingly, the drawing and description are to be regarded as illustrative in nature, and not as restrictive.

What is claimed is:

1. An advanced receiver apparatus for processing multiple received signals with interfering signals, comprising:

an ordering unit for ordering users indices, wherein on a first iteration ordering is based on received signal power, and wherein on subsequent iterations ordering is based on confidence values;

a multi-user detector coupled to said ordering unit producing a plurality of surviving states;

a voting unit coupled to said multi-user detector for processing said surviving states and generating a set of soft estimates of channel symbols; and a decoder section coupled to said voting unit and said multi-user detector, wherein said decoder section processes said soft estimates of channel symbols to produce a final output on a final iteration, and wherein said decoder produces said confidence values for intermediate iterations.

2. The advanced receiver apparatus according to claim 1, further comprising a parameter estimation unit coupled to said ordering unit and said multi-user detector for processing said receiver signals and storing information on said signals.

3. The advanced receiver apparatus according to claim 1, wherein said decoder section is a bank of soft input soft output (SISO) decoders, and wherein said SISO decoders are selected from the group comprising: maximum a posteriori (MAP) decoders and soft-output Viterbi algorithm (SOVA) decoders.

4. The advanced receiver apparatus according to claim 1, wherein said multi-user detector uses an algorithm selected from the group comprising: an M-algorithm, T-algorithm, or MT-algorithm, based upon MAP, Log-MAP, or Max-Log MAP detectors.

5. The advanced receiver apparatus according to claim 1, further comprising an interleaver coupled between said multi-user detector and said voting section and a deinterleaver coupled between said decoder section and said ordering unit.

6. The advanced receiver apparatus according to claim 1, further comprising a filter unit coupled to said multi-user detector.

7. The advanced receiver apparatus according to claim 6, wherein said filter unit is selected from the group comprising: a whitening matched filter bank and a matched filter bank.

8. The advanced receiver apparatus according to claim 1, further comprising a means for determining said final iteration, wherein said means is a fixed number of iterations.

9. The advanced receiver apparatus according to claim 1, further comprising a means for determining said final iteration, wherein said means is an allowable difference between previous confidence values and current confidence values.

10. A method for processing receiver signals from multiple users, comprising the steps of:

processing said receiver signals in a front end to generate a digital stream of signal samples;

performing parameter estimation of said digital stream;

ordering of users, wherein said ordering is a power ordering of said digital stream on a first iteration, and confidence ordering on subsequent iterations;

detecting a plurality of survivors from a set of symbol streams for each user;

voting on said survivors to generate a set of a soft-valued outputs, one stream for each user;

decoding said soft-valued outputs to form a set of confidence values;

repeating said steps of confidence ordering, detecting, voting, and decoding until a final state is obtained; and outputting data estimates corresponding to a set of data bits.

11. The method for processing receiver signals according to claim 10, wherein said final state is determined by setting a fixed number of iterations.

12. The method for processing receiver signals according to claim 11, wherein said fixed number of iterations is one in a non-iterative mode.

13. The method for processing receiver signals according to claim 10, wherein said final state is determined by establishing an allowable difference between previous confidence values and current confidence values.

14. The method for processing receiver signals according to claim 10, further comprising the step of processing said digital signal with a filter bank to create one or a set of measurements corresponding to each filter and symbol-time pair.

15. The method for processing receiver signals according to claim 10, further comprising the steps of interleaving and de-interleaving.

16. The method for processing receiver signals according to claim 10, further comprising the step of filtering said digital stream.

17. A receiver system for processing signals from multiple users with interfering signals, comprising:
   a front end unit for receiving and processing incoming receptions;
   a parameter estimator unit coupled to said front end unit for processing said receptions;
   a filter section coupled to said front end unit;
   an ordering unit coupled to said parameter estimation unit for ordering users indices, wherein on a first iteration ordering is based on received signal power, and wherein on subsequent iterations ordering is based on confidence values;
   a multi-user detector coupled to said ordering unit and said filter section producing a plurality of surviving states;
   a voting unit coupled to said multi-user detector for processing said surviving states and generating a set of soft estimates of channel symbols; and
   a decoder section coupled to said voting unit and said multi-user detector, wherein said decoder section processes said soft estimates of channel symbols to produce a final output on a final iteration, and wherein said decoder produces said confidence values for intermediate iterations.

18. The receiver system according to claim 17, wherein said decoders is SISO decoder selected from the group comprising: maximum a posteriori (MAP) decoders and soft-output Viterbi algorithm (SOVA) decoders.

19. The receiver system according to claim 17, wherein said multi-user detector uses an algorithm selected from the group comprising: an M-algorithm, T-algorithm, or MT-algorithm, based upon MAP, Log-MAP, or Max-Log MAP detector.

20. The receiver system according to claim 17, further comprising an interleaver coupled between said multi-user detector and said voting section and a deinterleaver coupled between said decoder section and said ordering unit.

21. The receiver system according to claim 17, wherein said filter section is selected from the group comprising: a whitening matched filter bank and a matched filter bank.

22. The receiver system according to claim 17, further comprising a means for determining said final iteration, wherein said means is a fixed number of iterations.

23. The receiver system according to claim 17, further comprising a means for determining said final iteration, wherein said means is an allowable difference between previous confidence values and current confidence values.

* * * * *